United States Patent [19]

Wong

[11] 4,145,661
[45] Mar. 20, 1979

[54] PRECISION MEASURING AMPLIFIER

[75] Inventor: George S. K. Wong, Ottawa, Canada

[73] Assignee: Canadian Patents and Development Limited, Ottawa, Canada

[21] Appl. No.: 865,235

[22] Filed: Dec. 28, 1977

[51] Int. Cl.² ............ G01R 15/10; G01R 19/02; G01R 17/02

[52] U.S. Cl. .................. 328/145; 328/159; 324/132

[58] Field of Search ............ 328/145, 159; 324/132; 364/857

[56] References Cited

U.S. PATENT DOCUMENTS

| | | | |
|---|---|---|---|
| 3,500,198 | 3/1970 | Kaiser et al. | 324/132 |
| 3,971,984 | 7/1976 | Bench | 324/132 |
| 4,000,463 | 12/1976 | Katzmann et al. | 324/132 |
| 4,091,329 | 5/1978 | Fletcher et al. | 328/145 |
| 4,113,997 | 9/1978 | Horna | 324/132 X |

Primary Examiner—John S. Heyman
Attorney, Agent, or Firm—Edward Rymek

[57] ABSTRACT

The precision measuring amplifier includes one or more amplifiers, a number of fixed attenuators, a RMS detector and a logarithmic converter for converting the output of the RMS detector to a logarithmic value. A number of fixed voltage sources each providing a voltage precisely related to the attenuation of a corresponding attenuator, are selectively coupled to a summing amplifier to which the logarithmic converter output is also connected. The number of attenuators connected either manually or automatically into amplifier apparatus at one time is dependent on the input signal level, and for every attenuator connected into the amplifier apparatus, a voltage source is connected to the summing amplifier to provide an output signal proportional to the logarithm of the RMS value of the input signal.

5 Claims, 3 Drawing Figures

PRECISION MEASURING AMPLIFIER

BACKGROUND OF THE INVENTION

This invention is directed to an amplifier system for making precision ac measurements, and in particular, to a precision measuring amplifier having a broad dynamic range.

In precision ac measurements, it is conventional to employ attenuators to extend the dynamic range of the measuring system. The attenuators may be resistive, capacitive or inductive as in the case of ratio transformer, and in all cases, the precision of the measuring system is limited by the precision of the attenuators.

The B & K model 2608 (or model 2606) is typical of the commercial measuring amplifiers used in acoustics applications. In general such an amplifier includes in series an input amplifier, a variable input attenuator, a second amplifier, a weighting circuit, a third amplifier, a variable output attenuator, an RMS detector, a time constant circuit and an analogue meter. The weighting circuit and the time constant circuit respectively provide the prescribed response characteristics and time constants usually employed in a sound level meter. The analogue meter is usually calibrated in dB and therefore has scale divisions which are uneven. The magnitude of the input signal to the measuring amplifier is obtained by adding the decibel values indicated by the positions of the attenuators (or by means of internal mechanical switch arrangement to activate a range indicator lamp), plus the reading of the analogue meter.

The overall error of such an amplifier system is the sum of the main error sources which are the attenuators and the RMS detector which is normally in the order of ± 0.7 dB.

SUMMARY OF THE INVENTION

It is therefore an object of this invention to provide a precision measuring amplifier having a wide dynamic range and a low error factor.

This and other objects are achieved in a measuring amplifier apparatus which includes amplifiers, an attenuator circuit for selectively attenuating the input signal by fixed attenuating steps, an RMS detector for converting the attenuated input signal to a dc signal representative of the RMS value of the input signal, and a logarithmic converter for converting the dc signal to a logarithmic value. The apparatus further includes a voltage source for providing an output signal equivalent to the selected attenuation of the input signal at the logarithmic converter output, and a summing amplifier for adding the logarithmic converter output signal and the voltage source output signal to provide an output signal proportional to the logarithm of the RMS value of the input signal.

In accordance with another aspect of the invention, the apparatus includes a control circuit which responds to an input signal that is higher or lower than predetermined threshold levels to respectively switch discrete attenuators into or out of the amplifier apparatus circuit as well as connect or disconnect corresponding discrete voltage sources to or from the summing amplifier.

Many other objects and aspects of the invention will be clear from the detailed description of the drawings.

DESCRIPTION OF THE PREFERRED EMBODIMENT

Figure 1:
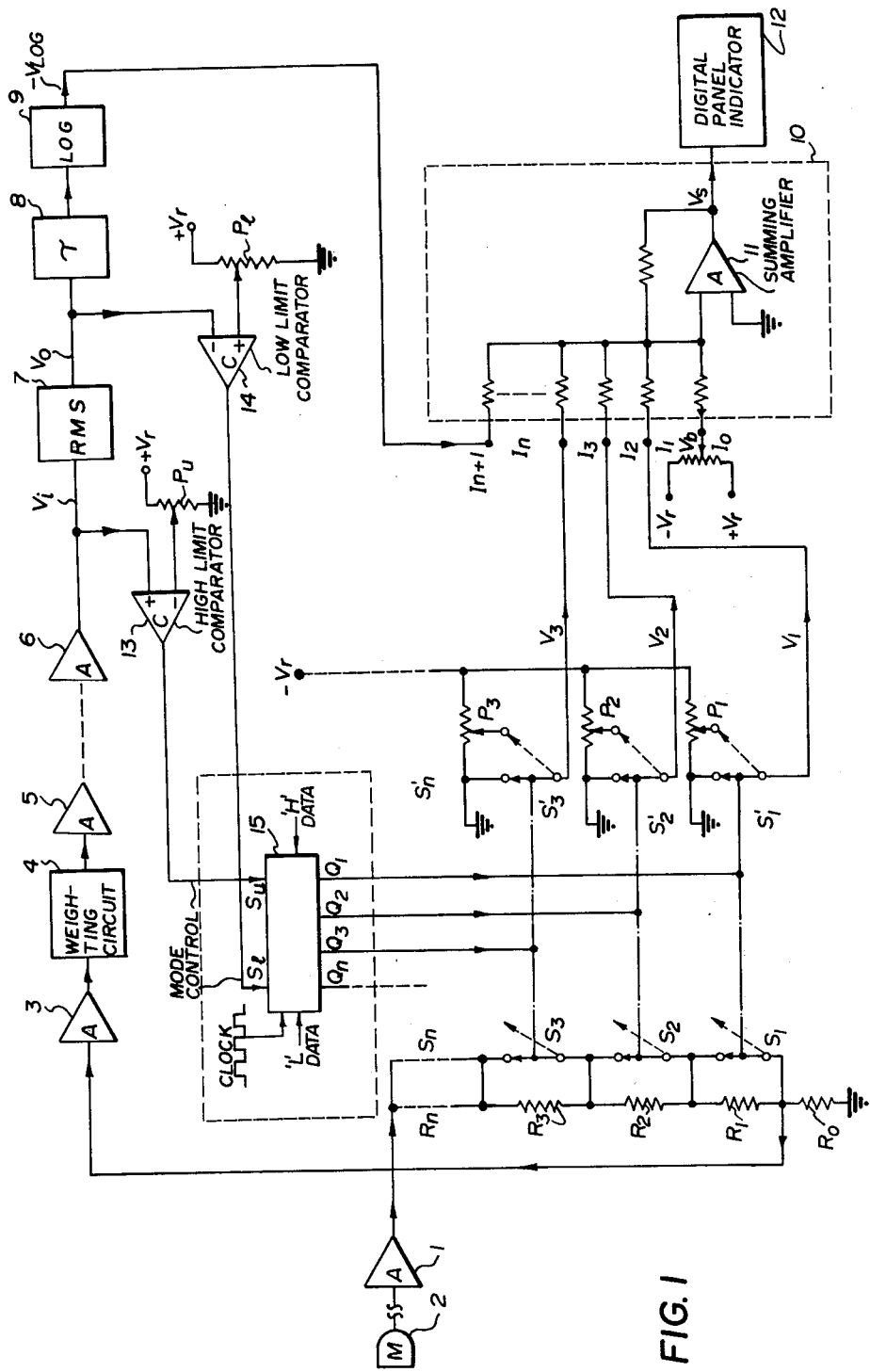
FIG. 1 illustrates an embodiment of the precision measuring amplifier system in accordance with this invention.

The measuring amplifier system illustrated in FIG. 1 includes a preamplifier 1 which receives the signal to be measured from a microphone 2 or from some other such source. Preamplifier 1 is basically a high input impedance amplifier, sometimes called a Cathode Follower, with unity gain. It has low noise level and can handle signals from microvolts to 90 V peak to peak. Preamplifier 1 can be made part of the microphone arrangement. The output of preamplifier 1 is connected to an attenuator consisting of a series of resistors $R_0$, $R_1$, $R_2$, $R_3$, ... $R_n$. Electrically controlled switches $S_1$, $S_2$, $S_3$, ... $S_n$ are connected across each of the resistors $R_1$, $R_2$, $R_3$, ... $R_n$ respectively such that the resistors are shorted out when their respective switches are closed. The output of the attenuator at the junction between $R_0$ and $R_1$ is connected to a first amplifier 3, a weighting circuit 4, a second amplifier 5, and an output amplifier 6. Though not shown, a second attenuator with a series of resistors and switches may be incorporated between amplifiers 5 and 6, or resistors $R_1$, $R_2$, $R_3$, ... $R_n$ and their corresponding switches $S_1$, $S_2$, $S_3$, ... $S_n$ may alternately be positioned between amplifiers 5 and 6. More attenuators and amplifier stages may be added if desired. Amplifiers 3 and 5 are low noise amplifiers with relatively high input impedance and moderate gain ranging from 2 to 10. Amplifier 6 is again a low noise amplifier with relatively high input impedance, it has a gain of approximately 450. Amplifier 6 may be replaced by several lower gain stages if preferred. The weighting circuit consists of selectable frequency response network specified by ANSI-S1.4-1971 (U.S.A.), they are called A, B, C relative response weighting.

The output of amplifier 6 is connected to an RMS detector 7 which provides an output voltage $V_o$ equivalent to the RMS value of the input signal. The detector 7 is connected to a time constant circuit 8 which smoothes the voltage $V_o$. The time constant circuit is connected to a logarithmic converter 9 which converts $V_o$ into a logarithmic response in decibels. Logarithmic converter 9 is connected to input $I_{n+1}$ of a summing circuit 10. Summing circuit 10 includes a summing amplifier 11 as well as inputs $I_0$, $I_1$, $I_2$, $I_3$, ... $I_n$ in addition to input $I_{n+1}$. Input $I_0$ is connected to a bias voltage $V_b$ for scale bias adjustment. The summing amplifier 11 is connected to an indicator 12 which is preferrably a digital meter for providing a digital reading in decibels.

The remaining inputs $I_1$, $I_2$, $I_3$, ... $I_n$ are connected through switches $S_1'$, $S_2'$, $S_3'$, ... $S_n'$ respectively to fixed voltages $V_1$, $V_2$, $V_3$, ... $V_n$ obtained from potentiometers $P_1$, $P_2$, $P_3$, ... $P_n$ respectively. Switches $S_1$, $S_2$, $S_3$, ... $S_n$ are simultaneously operated with switches $S_1'$, $S_2'$, $S_3'$, ... $S_n'$ such that in their first position, as shown in FIG. 1, resistors $R_1$, $R_2$, $R_3$, ... $R_n$ are shorted out and inputs $I_1$, $I_2$, $I_3$, ... $I_n$ are grounded. In their second positions, $R_1$, $R_2$, $R_3$, ... $R_n$ are connected into the input circuit to increase attenuation and predetermined fixed voltages $V_1$, $V_2$, $V_3$, ... $V_n$ are placed on inputs $I_1$, $I_2$, $I_3$, ... $I_n$.

The control of switches $S_1, S_2, S_3, \ldots S_n$ and $S_1', S_2', S_3', \ldots S_n'$ to set the range may be carried out manually or automatically as will be described later.

In operation, one or more of the resistors $R_1, R_2, R_3, \ldots R_n$ of the attenuator are placed in the input circuit to prevent the amplifiers 3, 5 or 6 and the RMS detector 7 from overloading. When the input signal to preamplifier 1 is small, all switches $S_1, S_2, S_3, \ldots S_n$ are closed and there is no attenuation. At the same time all switches $S_1', S_2', S_3', \ldots S_n'$ are closed to ground inputs $I_1, I_2, I_3, \ldots I_n$ respectively. When the input signal is greater than some predetermined level, switches $S_1$ and $S_1'$ are opened. $R_1$ provides a predetermined attenuation to the input signal, the attenuation may be at any selected level, however for description purposes, an attenuation of 20 dB will be assumed. The logarithmic converter 9 sensitivity may also be at any selected level, however a sensitivity of 0.2 V/20dB will be assumed, for every 20 dB variation of the input signal, the output changes by 0.2 V. Therefore with one resistor $R_1$ in the circuit $V_{log}=(\log V_0-0.2)$ where $V_{log}$ is the output from logarithmic converter 9, $V_0$ is the signal at the output of the RMS detector 7, and 0.2 is the voltage drop due to the 20 dB attenuation with $R_1$. At the same time, switch $S_1'$ couples potentiometer $P_1$ to input $I_1$ and adds a voltage $V_1$ of 0.2V to $V_{log}$ through the summing amplifier 11. The output $V_s$ of the summing amplifier 11 will therefore be $V_s=(\log V_0-0.2)+0.2+V_b$. Voltages can thus be added to the output signal of the logarithmic converter 9 to represent attenuation since the RMS detector 7 output signal $V_0$ is converted to a logarithmic value.

With ever greater input signals, resistors $R_2, R_3, \ldots R_n$ can be selectively switched into the circuit by opening switches $S_2, S_3, \ldots S_n$, and voltages from potentiometers $P_2, P_3, \ldots P_n$ are applied to inputs $I_2, I_3, \ldots I_n$ of the summing amplifier 11. Thus with ever larger input signals the output of the summing amplifier 11 provides an ever larger output having a broad range though the actual signal through the RMS detector 7 remains below some preselected level.

Figure 2:
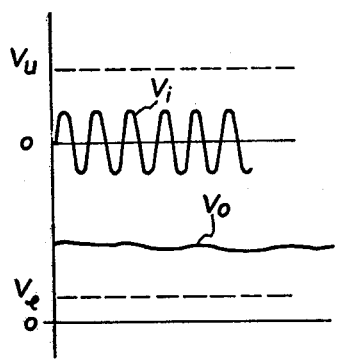
FIG. 2 illustrates the signal at two points of the system in FIG. 1.

To automate the amplifier apparatus, corresponding switches $S_1, S_2, S_3, \ldots S_n$ and $S_1', S_2', S_3', \ldots S_n'$ which in this case are preferably solid state switches are ganged together, and a first comparator 13 and a second comparator 14 are provided. Comparator 13 has the positive input coupled to the output of amplifier 6 and the negative input biased by a potentiometer $P_u$ such that comparator 13 changes to an "H" state when the signal $V_i$ from amplifier 6 peaks at a level greater than the upper limit set by $P_u$. In a similar manner, comparator 14 has the negative input coupled to the output $V_0$ of RMS detector 7 and the positive input biased by a potentiometer $P_l$ such that comparator 13 changes to an "H" state when the signal $V_0$ falls below a lower limit set by $P_l$. Examples of the signals $V_i$ and $V_0$ with threshold levels are shown in FIG. 2.

The control circuit further includes a clocked shift register 15 such as the type MC 14194B, which can be cascaded to provide multiple output shift-registers, with mode control inputs $S_u$ and $S_l$ and a series of outputs $Q_1, Q_2, Q_3, \ldots Q_n$ connected to switches $S_1, S_1'; S_2, S_2'; S_3, S_3'; \ldots S_n, S_n'$ respectively. Data shifts to the left when the input to $S_u$ is "H" and the input to $S_l$ is "L," data shifts to the right when the input to $S_u$ is "L" and the input to $S_l$ is "H," and holds when the inputs to $S_u$ and $S_l$ are both "L." As the register 15 shifts to the left, an "H" signal is provided on outputs $Q_1$, then $Q_1$ and $Q_2$, then $Q_1, Q_2$ and $Q_3$, and so on to operate the switches to which they are connected. This opens the switches and adds attenuation to the circuit until $V_i$ falls below the upper limit set by $P_u$ and the comparator 13 output goes "L" to hold the shift register 15. If $V_0$ drops in value below the lower limit set by $P_l$, comparator 14 changes to "H" and the shift register 15 shifts to the right, sequentially closing the switches and decreases the attenuation of the circuit until $V_0$ is above the lower limit, and then the shift register holds.

One requirement for the control circuit is that the dynamic range between the upper limit (signal peak level) and the lower limit (signal RMS level) must be larger than the attenuation steps for a stable operation.

Figure 3:
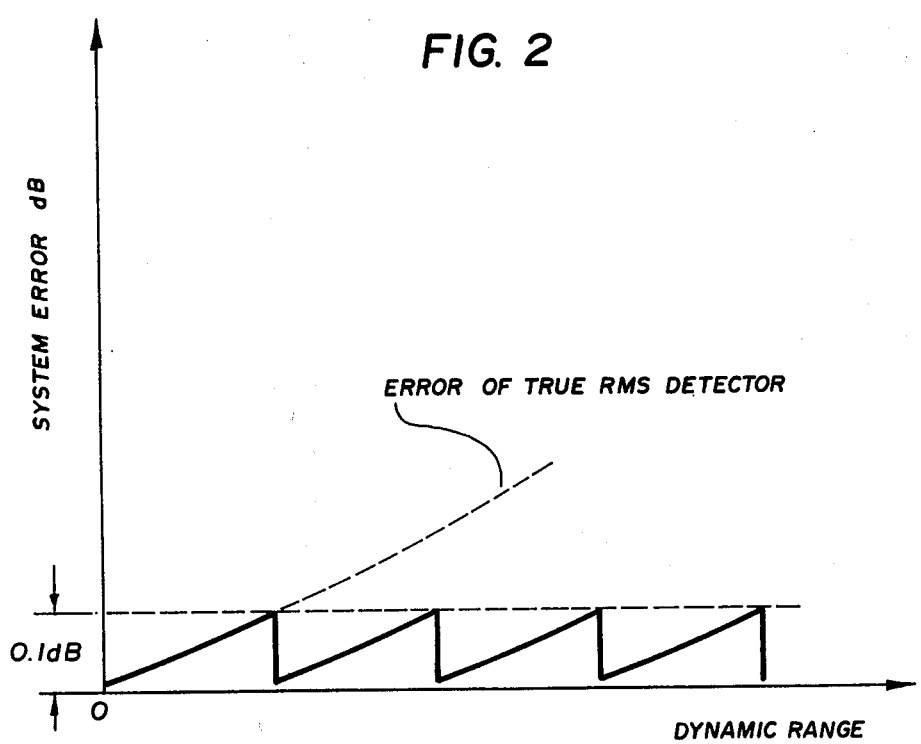
FIG. 3 illustrates the error of the precision measuring amplifier across its dynamic range.

The measuring amplifier system in accordance with the present invention has many advantages. The ratio accuracy of the attenuators need not be stringent, since voltages are added to the output $V_s$ to represent attenuation, and with multiturn trimming potentiometers, an equivalent accuracy of better than $\pm 0.01$ dB can be attained. The error of the system is noncumulative as seen in FIG. 3. Tests have shown that with five switches ($S_1$ to $S_5$) and over a dynamic range exceeding 110 dB, the overall accuracy approaches the resolution which is $\pm 0.1$ dB. The precision of the system is independent of the precision of the attenuators (trimmable to zero error), hence a wide dynamic range can be achieved without degrading system accuracy.

Many modifications in the above described embodiment can be carried out without departing from the scope thereof. For example, RC circuits $R_1C_1, R_2C_2, \ldots R_nC_n$ may be included in each of the inputs $I_1, I_2, \ldots I_n$ such that the voltages $V_1, V_2, V_3, \ldots V_n$ are smoothly applied to inputs $I_1, I_2, \ldots I_n$ by controlling the charging rate of the capacitors $C_1, C_2, \ldots C_n$. Resistors $R_1, R_2, \ldots R_n$ also control the discharge rate when the inputs are grounded by the switches $S_1, S_2, \ldots S_n$. In addition, an up-down counter and some decoding circuits could replace the shift register to perform the control of the attenuator and potentiometer switches. Therefore, the scope of the present invention is intended to be limited only by the appended claims.

What is claimed is:

1. Measuring amplifier apparatus comprising:
   amplifier means for amplifying an input signal to be measured;
   attenuator means for selectively attenuating the input signal by fixed attenuating steps;
   detector means for converting the attenuated input signal to a dc signal representative of the RMS value of the input signal;
   logarithmic converter means for converting the dc signal to a logarithmic value;
   voltage source means for providing an output signal equivalent to the selected attenuation of the input signal at the logarithmic converter output; and
   summing amplifier means for adding the logarithmic converter means output signal and the voltage source means output signal to provide an output signal proportional to the logarithm of the RMS value of the input signal.

2. Measuring amplifier apparatus as claimed in claim 1 wherein said attenuator means includes a number of fixed resistors n, connected in series, each resistor is parallel connected with a switch for shorting out the resistor when closed.

3. Measuring amplifier apparatus as claimed in claim 2 wherein said voltage source means includes a number of fixed discrete voltage sources n, each voltage source having a value precisely related to one predetermined attenuation, and each voltage source having a switch for coupling the voltage source to the summing amplifier.

4. Measuring amplifier apparatus as claimed in claim 3 which further includes control means for operating the attenuator switches and corresponding voltage source switches as a function of the input signal amplitude.

5. Measuring amplifier apparatus as claimed in claim 4 wherein the control means includes first threshold detector means and second threshold detector means, the first threshold detector means is connected to the RMS detector means input to provide a first control signal in response to an input signal above a predetermined threshold, said control signal operates to close one or more of the attenuator switches and the corresponding voltage source switches, the second threshold detector means is connected to the RMS detectors means output to provide a second control signal in response to an input signal below a predetermined threshold, said second control signal operates to open one or more of the attenuator switches and the corresponding voltage source switches.

* * * * *